United States Patent [19]
Takeuchi et al.

[11] Patent Number: 5,691,593
[45] Date of Patent: Nov. 25, 1997

[54] PIEZOELECTRIC/ELECTROSTRICTIVE ACTUATOR HAVING AT LEAST ONE PIEZOELECTRIC/ELECTROSTRICTIVE FILM

[75] Inventors: Yukihisa Takeuchi, Nishikamo-gun; Koji Kimura; Masato Komazawa, both of Nagoya, all of Japan

[73] Assignees: NGK Insulators, Ltd.; Seiko Epson Corporation, both of Japan

[21] Appl. No.: 392,083

[22] Filed: Feb. 22, 1995

Related U.S. Application Data

[63] Continuation-in-part of Ser. No. 384,469, Feb. 2, 1995, which is a continuation of Ser. No. 102,960, Aug. 6, 1993, abandoned, which is a continuation of Ser. No. 860,128, Mar. 31, 1992, abandoned, which is a continuation of Ser. No. 550,977, Jul. 11, 1990, abandoned.

[30] Foreign Application Priority Data

| Jul. 11, 1989 | [JP] | Japan | 1-178747 |
| Jan. 20, 1990 | [JP] | Japan | 2-011174 |

[51] Int. Cl.$^6$ .................................................. H01L 41/08
[52] U.S. Cl. ...................... 310/328; 310/330; 310/332; 310/324; 310/363; 310/346
[58] Field of Search .................... 310/328, 330–332, 310/363, 364, 366, 358, 359

[56] References Cited

U.S. PATENT DOCUMENTS

| | | | |
|---|---|---|---|
| 2,540,194 | 2/1951 | Ellett | 310/358 |
| 3,509,387 | 4/1970 | Thorn et al. | 310/321 X |
| 4,383,763 | 5/1983 | Hutchings et al. | 310/332 X |
| 4,456,850 | 6/1984 | Inoue et al. | 310/331 X |
| 4,491,761 | 1/1985 | Grudkowski et al. | 310/334 |
| 4,564,851 | 1/1986 | Nilsson | 310/330 X |
| 4,633,120 | 12/1986 | Sato et al. | 310/359 X |
| 4,638,206 | 1/1987 | Tsunooka et al. | 310/365 X |
| 4,649,313 | 3/1987 | Ogawa et al. | 310/332 X |
| 4,680,595 | 7/1987 | Cruz-Uribe et al. | 310/323 |
| 4,697,118 | 9/1987 | Hamden, Jr. et al. | 310/332 |
| 4,742,260 | 5/1988 | Shimizu et al. | 310/330 X |
| 4,742,264 | 5/1988 | Ogawa | 310/359 X |
| 4,766,671 | 8/1988 | Utsumi | 29/848 |
| 4,769,570 | 9/1988 | Yokoyama | 310/332 |
| 4,780,639 | 10/1988 | Shirasu | 310/358 X |
| 4,783,821 | 11/1988 | Muller et al. | 310/324 X |
| 4,825,227 | 4/1989 | Fischbeck et al. | 310/359 X |
| 4,906,840 | 3/1990 | Zdeblick et al. | 310/332 X |
| 5,059,566 | 10/1991 | Kanai et al. | 501/138 |
| 5,126,615 | 6/1992 | Takeuchi et al. | 310/330 |
| 5,210,455 | 5/1993 | Takeuchi et al. | 310/359 X |
| 5,281,888 | 1/1994 | Takeuchi et al. | 310/366 |

FOREIGN PATENT DOCUMENTS

| | | | |
|---|---|---|---|
| 0262637 | 4/1988 | European Pat. Off. | |
| 2570223 | 3/1986 | France . | |
| 45-6103 | 3/1970 | Japan . | |
| 46-26140 | 9/1971 | Japan . | |
| 0196069 | 11/1983 | Japan | 310/366 |
| 0253873 | 11/1986 | Japan | 310/363 |
| 62-213399 | 9/1987 | Japan | 310/330 |
| 2161647 | 1/1986 | United Kingdom | 310/358 |
| 89/07259 | 8/1989 | WIPO . | |

Primary Examiner—Mark O. Budd
Attorney, Agent, or Firm—Parkhurst, Wendel & Burr, L.L.P.

[57] ABSTRACT

A piezoelectric/electrostrictive actuator including a ceramic substrate, and at least one piezoelectric/electrostrictive actuator unit formed on at least a portion of at least one surface of the substrate, each piezoelectric/electrostrictive actuator unit having a first electrode film, a piezoelectric/electrostrictive film and a second electrode film which are laminated in the order of description, with the piezoelectric/electrostrictive actuator unit formed on the substrate by heat treatment.

24 Claims, 5 Drawing Sheets

PIEZOELECTRIC/ELECTROSTRICTIVE ACTUATOR HAVING AT LEAST ONE PIEZOELECTRIC/ELECTROSTRICTIVE FILM

CROSS REFERENCE TO RELATED APPLICATIONS

The present application is a continuation-in-part of U.S. Ser. No. 08/384,469, filed Feb. 2, 1995 which in turn is a continuation of U.S. Ser. No. 08/102,960, filed Aug. 6, 1993, now abandoned which in turn is continuation of U.S. Ser. No. 07/860,128, filed Mar. 31, 1992, now abandoned. The '128 application is a continuation of U.S. Ser. No. 07/550,977, filed Jul. 11, 1990, now abandoned.

BACKGROUND OF THE INVENTION

1. Field of the Invention

The present invention relates to a bi-morph or uni-morph type piezoelectric or electrostrictive actuator used as or for a displacement-controllable element, a solid element motor, an ink Set ejector, a relay, a switching element, a camera shutter, a print head, a pump, a fan or blower, and other components or devices. The term "actuator" used herein is a member capable of transducing or converting an electric energy into a mechanical force, displacement or strain.

2. Discussion of the Prior Art

Recently, an element whose displacement can be controlled has been widely used and increasingly needed in the fields of optics and precision positioning or machining operations, for example, for adjusting or changing an optical path length or the position of a member or component of a device, on the order of fractions of a micron (μm). To meet this need, there have been proposed and developed various piezoelectric or electrostrictive actuators utilizing a piezoelectric or electrostrictive material such as a ferroelectric material, which exhibits the reverse or converse piezoelectric effect or the electrostrictive effect, in which the application of a voltage or electric field to such a piezoelectric or electrostrictive material produces a mechanical displacement.

Conventionally, the piezoelectric/electrostrictive actuator is structurally classified into a mono-morph type, a uni-morph type, a bi-morph type and a lamination type. The mono-morph, uni-morph and hi-morph types provide a relatively large amount of bending or flexural displacement or deflection or distortion owing to the transverse mode of converse piezoelectric or electrostrictive effect, namely, due to the strain perpendicular to the direction of the electric field produced upon application of a voltage. However, these types suffer from inherent problems such as a small magnitude of a force generated, a low response speed, a low level of electro-mechanical conversion efficiency, and a low degree of operating reliability due to the use of an adhesive for bonding the component layers. On the other hand, the lamination type utilizes the longitudinal mode of converse piezoelectric or electrostrictive effect, namely, the strain parallel to the direction of the electric field, and therefore assures a large magnitude of the generated force, a high response speed, and a high level of electro-mechanical conversion efficiency. However, the lamination type suffers from an inherent problem that the amount of displacement produced is relatively small.

The conventional piezoelectric/electrostrictive actuator of the uni-morph or bi-morph type also suffers from a relatively low operating reliability, which arises from the use of a bonding agent for bonding together the component sheets or plates of the actuator such as a piezoelectric/electrostrictive element.

Thus, the conventional piezoelectric or electrostrictive actuators have drawbacks as well as advantages, and suffer from some problems that should be solved.

SUMMARY OF THE INVENTION

It is accordingly, a first object of the present invention to provide a piezoelectric/electrostrictive actuator of uni-morph or hi-morph type which does not use a bonding adhesive or cement and which undergoes a sufficient amount of displacement by application of a relatively low voltage, with an improved response to the applied voltage.

Another object of the invention is to provide such piezoelectric/electrostrictive actuator wherein piezoelectric/electrostrictive actuator units are formed with high integration density on a substrate or support.

The above objects may be achieved according to the principle of the present invention, which provides a piezoelectric/electrostrictive actuator comprising a ceramic substrate, and at least one piezoelectric/electrostrictive actuator unit formed on at least a portion of at least one surface of the substrate. Each piezoelectric/electrostrictive actuator unit comprises a first electrode film, a piezoelectric or electrostrictive film and a second electrode film which are laminated in the order of description.

The piezoelectric/electrostrictive actuator of this invention wherein each piezoelectric/electrostrictive actuator unit consists of a laminar structure as described above provides a large amount of displacement by application of a relative low voltage applied thereto, with a high response to the applied voltage. Further, the laminar piezoelectric/electrostrictive actuator units may be formed with improved integration density on the substrate. Although the piezoelectric/electrostrictive actuator of the present invention which includes the laminated films integrally formed on the substrate is more or less similar in construction to the conventional bulk type laminar actuator, the present actuator is capable of undergoing a sufficient amount of flexural or bending displacement or distortion owing to the transverse mode of converse piezoelectric or electrostrictive effect produced upon application of an electric filed, and generating an accordingly large force, while assuring improved operating response.

Further, the electrode films and piezoelectric/electrostrictive film of the laminar structure are integrally laminated on the substrate, without a bonding adhesive as conventionally used for bonding thin component sheets of the known actuator of the uni-morph or hi-morph type. According to the present invention, discrete bonding layers present between the substrate, electrode films and piezoelectric or electrostrictive film, are eliminated. Additionally, bonding adhesive materials mixed within the layers of the electrode and/or piezoelectric film are eliminated. The materials which are eliminated correspond to those understood by the artisan which are considered adhesive materials. As defined in Chemical Dictionary, Morikita Publishing Company and Glossary of Chemical Terms, Van Nostrand Reinhold Company, an adhesive is a substance applied to an interface between two other substances (similar or dissimilar substances), for forming a bond between contact surfaces of the two other substances. Three fundamental requirements of an adhesive are fluidity, wettability on a surface of a solid, and solidification. Other requirements include: small volumetric shrinkage upon solidification; freedom from loss of bonding stability due to internal stresses which arise from variations in temperature and humidity; high resistance to water, heat and aging; and high freedom from creep under load for a long time, and high shock resistance. Adhesives are classified, in terms of fluidity and solidification characteristics, into (1) solution and emulsion type, (2) hot-melt type, (3) monomer or pre-polymer type, and (4) pressure-sensitive type. Typical examples of these types respectively include: (1) chloroprene, SBR, Natural rubber, polyvinyl acetate, polyacrylic acid ester, polyvinyl alcohol, carboxymethyl cellulose, (2) polyvinyl acetate, polyamide, polyvinyl butyral, (3) urea-, phenol-, cresol-, epoxy-, and alkyd-based adhesives, and cyano-acrylic acid ester, and (4) polyacrylic acid ester, polyvinyl ether. Additional examples include rubber, rosin, asphalt, semi-synthetics including various inorganic cements, and glass materials (e.g., water glass) which provide a bonding force after solidifying via cooling from a high-temperature molten state.

Due to elimination of the bonding adhesive, the present piezoelectric/electrostrictive actuator has improved operating reliability for a prolonged period of use, and the displacement to be produced by the actuator is subject to a minimum amount of drift.

The laminar structure according to the present invention permits the piezoelectric/electrostrictive actuator units to be easily formed with a relatively high density on the same surface of the substrate.

According to a finding of the applicants, for obtaining a large amount of flexural or bending displacement and the accordingly large magnitude of the force generated, the thickness of the present actuator is preferably 300 µm or less, and more preferably 150 µm or less, and the bending strength of the ceramic substrate is preferably at least 1200 kgf/cm$^2$, and more preferably at least 1500 kgf/cm$^2$.

BRIEF DESCRIPTION OF THE DRAWINGS

The above and optional objects, features and advantages of the present invention will be better understood by reading the following detailed description of the presently preferred embodiments of the invention, when considered in connection with the accompanying drawings, in which.

DETAILED DESCRIPTION OF THE PREFERRED EMBODIMENTS

Figure 1:
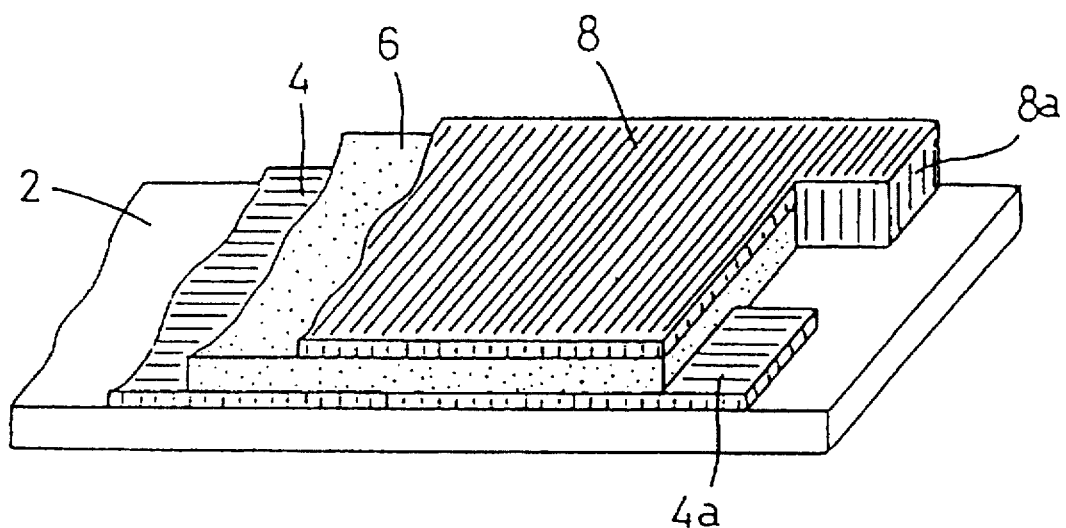
FIG. 1 through FIG. 7 are fragmentary perspective views illustrating different forms of the piezoelectric/electrostrictive actuator of the present invention.

Referring first to FIG. 1, there is shown an example of the piezoelectric or electrostrictive actuator of the present invention, wherein a piezoelectric/electrostrictive actuator unit is formed on one of opposite major surfaces of a generally elongate rectangular ceramic substrate 2. The piezoelectric/electrostrictive actuator unit is a laminar structure consisting of a first electrode film 4, a piezoelectric/electrostrictive film 6 and a second electrode film 8, which are integrally formed on the substrate in the order of description. The first and second electrode films 4, 8 have respective terminal portions 4a, 8a which extend beyond the appropriate end face of the piezoelectric/electrostrictive film 6. The terminal portion 8a covers a part of the end face of the film 6. In operation of the actuator, a voltage is applied between the first and second electrode films 4, 8 through the terminal portions 4a, 8a.

Figure 2:
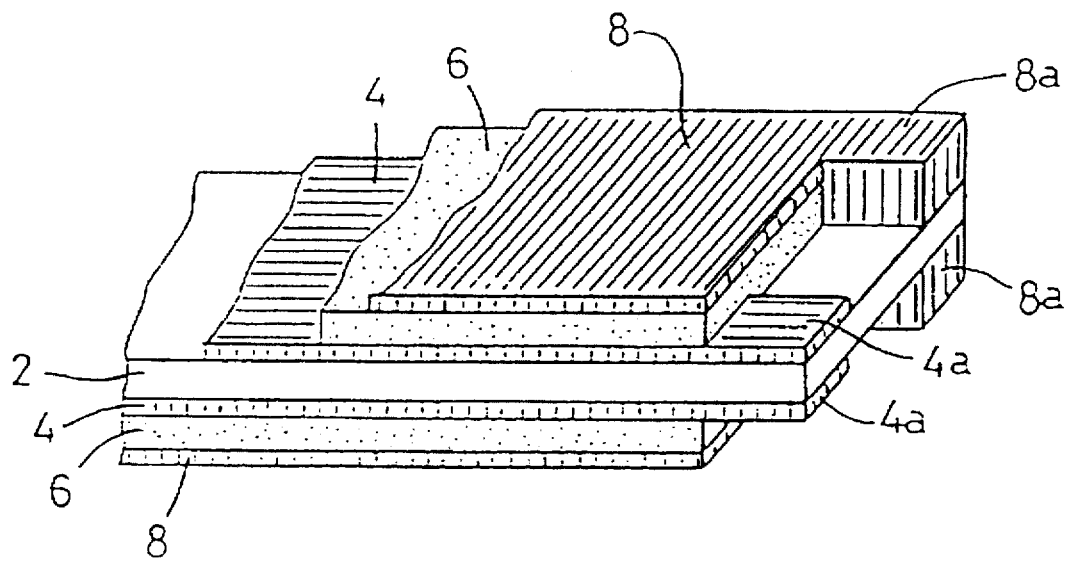

FIG. 2 shows an example of the piezoelectric/electrostrictive actuator in which two piezoelectric/electrostrictive actuator units are provided on the respective opposite major surfaces of the substrate 2. Each portion consists of the first and second electrode films 4, 8 and the piezoelectric/electrostrictive film 6 sandwiched by the two films 4, 6. The piezoelectric/electrostrictive actuator units (4, 6, 8) are structurally integrated with the substrate 2, by heat treatment.

Five different forms of the actuator which includes a plurality of piezoelectric/electrostrictive actuator units on the substrate 2 are illustrate in FIGS. 3 through 7, respectively. The piezoelectric/electrostrictive actuator units (4, 6, 8) are arranged in the direction which is either perpendicular or parallel to the major surfaces of the substrate 2, i.e., the plane of the substrate.

Figure 3:
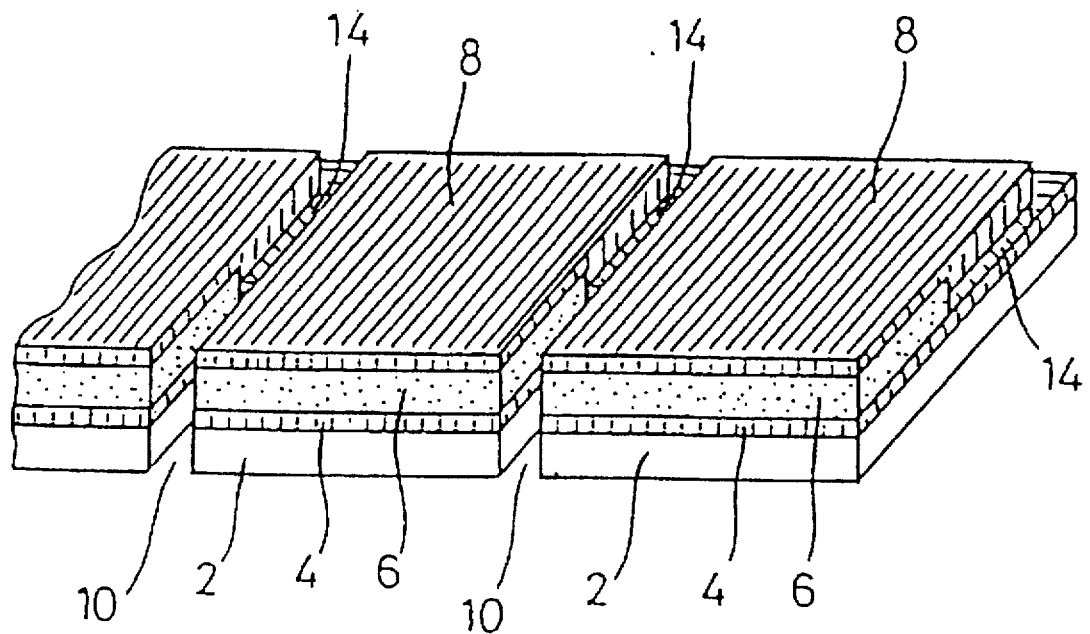
Figure 4:
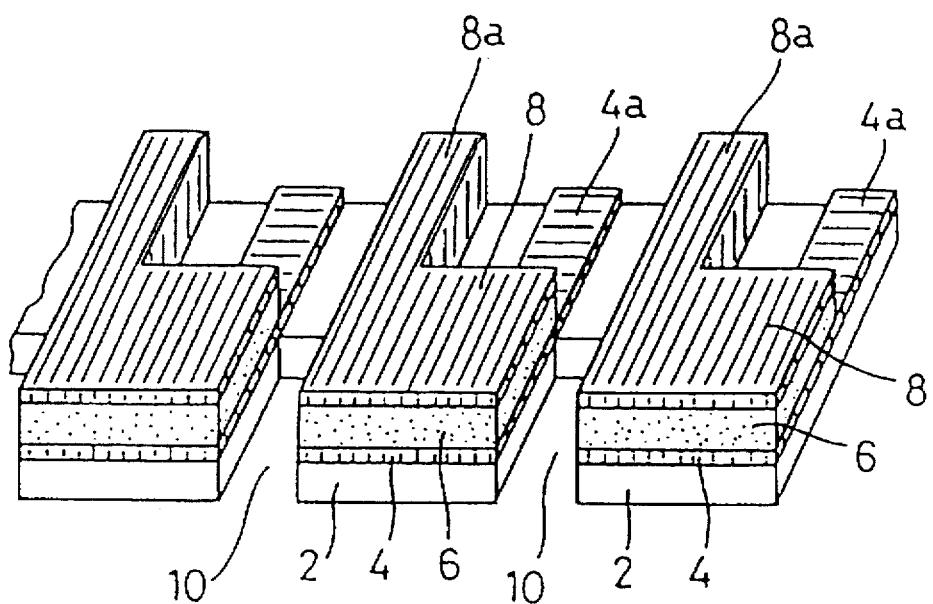
Figure 5:
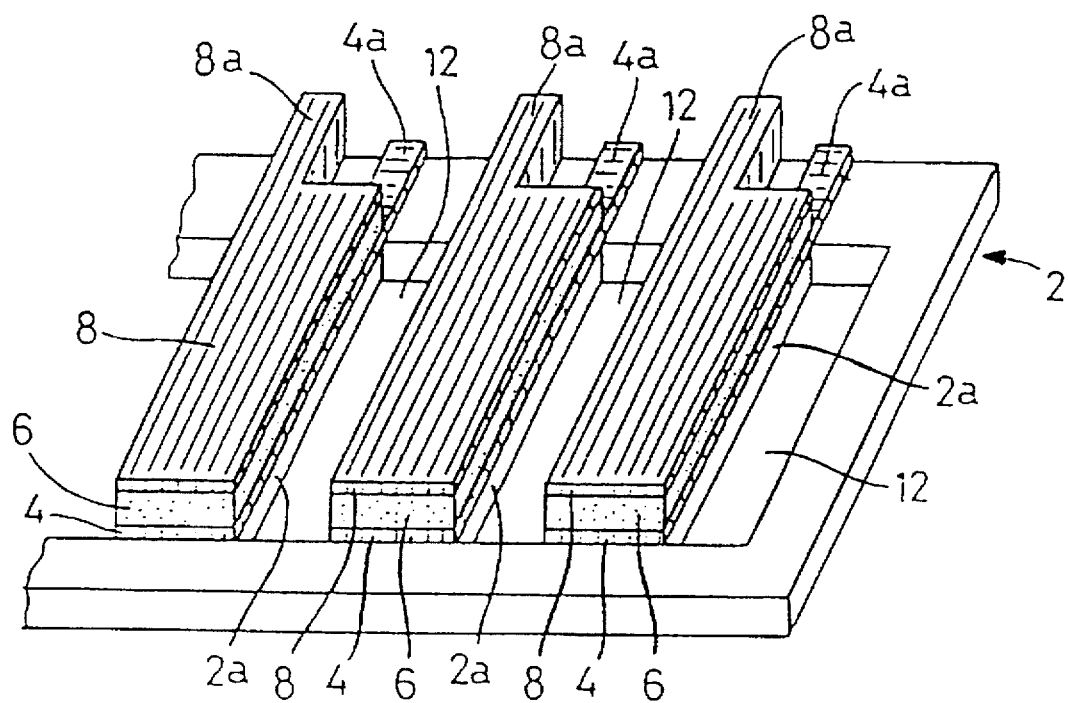

In the examples of FIGS. 3, 4 and 5, the plurality of piezoelectric/electrostrictive actuator units (4, 6, 8) are formed in parallel with each other on the same major surface of the elongate substrate 2, such that he piezoelectric/electrostrictive actuator units (4, 6, 8) are spaced from each other in the longitudinal direction of the substrate 2. In the actuator of FIGS. 3 and 4, the piezoelectric/electrostrictive actuator units (4,6,8) are separated from each other by rectangular slots 10 formed in respective portions of the ceramic substrate 2, each located between the adjacent piezoelectric/electrostrictive actuator units. The actuator of FIG. 3 has insulating films 14 which cover a rear part of the exposed end face of the piezoelectric/electrostrictive film 6, for electrically insulating the first and second electrode films 4, 8. In the actuator of FIG. 5, the ceramic substrate 2 has a plurality of elongate rectangular holes 12 formed therethrough at a suitable pitch in the longitudinal direction, so as to define a plurality of beam portions 2a. On each of the beam portions 2a of the substrate 2, there is formed a piezoelectric/electrostrictive actuator unit each consisting of the first electrode film 4, the piezoelectric/electrostrictive film 6 and the second electrode film 8.

Figure 6:
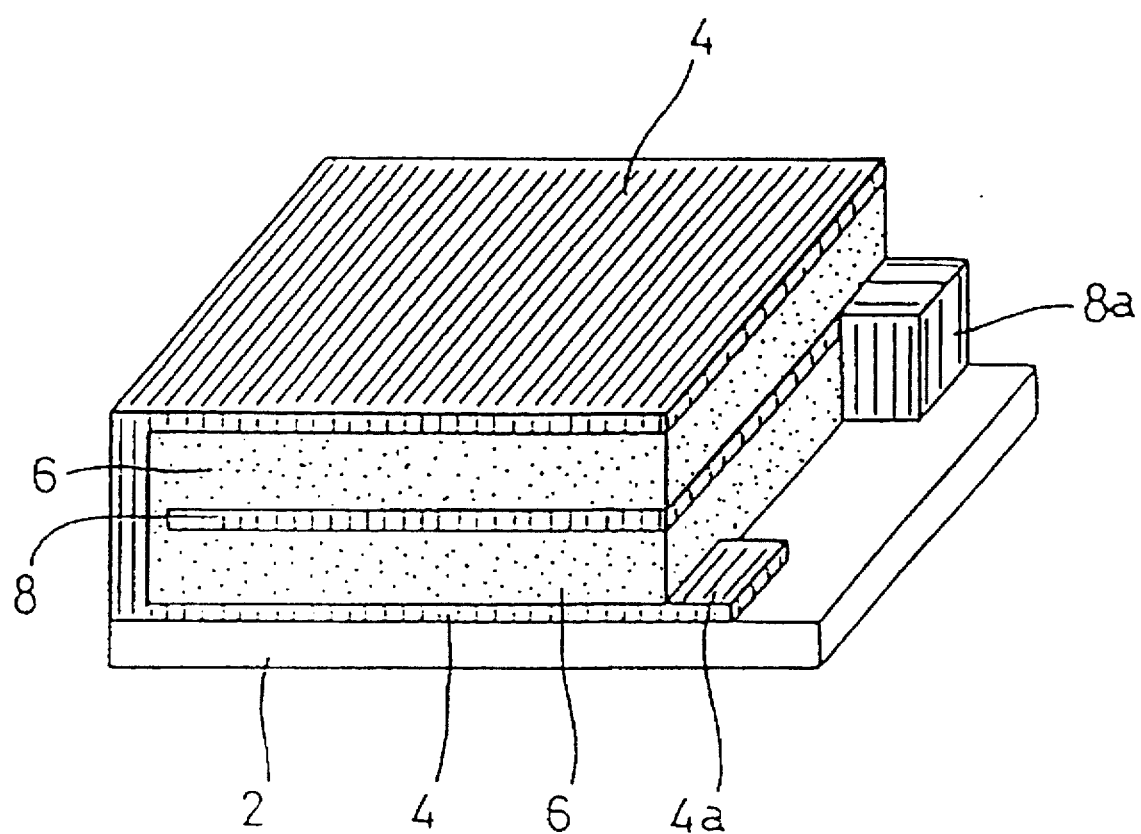

In the example of FIG. 6, the two piezoelectric/electrostrictive actuator units are superposed on each other on the same major surface of the ceramic substrate 2. More specifically, the first piezoelectric/electrostrictive actuator unit (4, 6, 8) is formed on the substrate 2, and the second piezoelectric/electrostrictive actuator unit (4, 6, 8) is formed on the first piezoelectric/electrostrictive actuator unit, such that the two first electrode films 4, 4, sandwich the two piezoelectric/electrostrictive films 6, 6 and the single common second electrode film 8, which separates the two films 6,6 from each other. The two piezoelectric/electrostrictive actuator units and the substrate constitute an integrally formed lamination.

Figure 7:
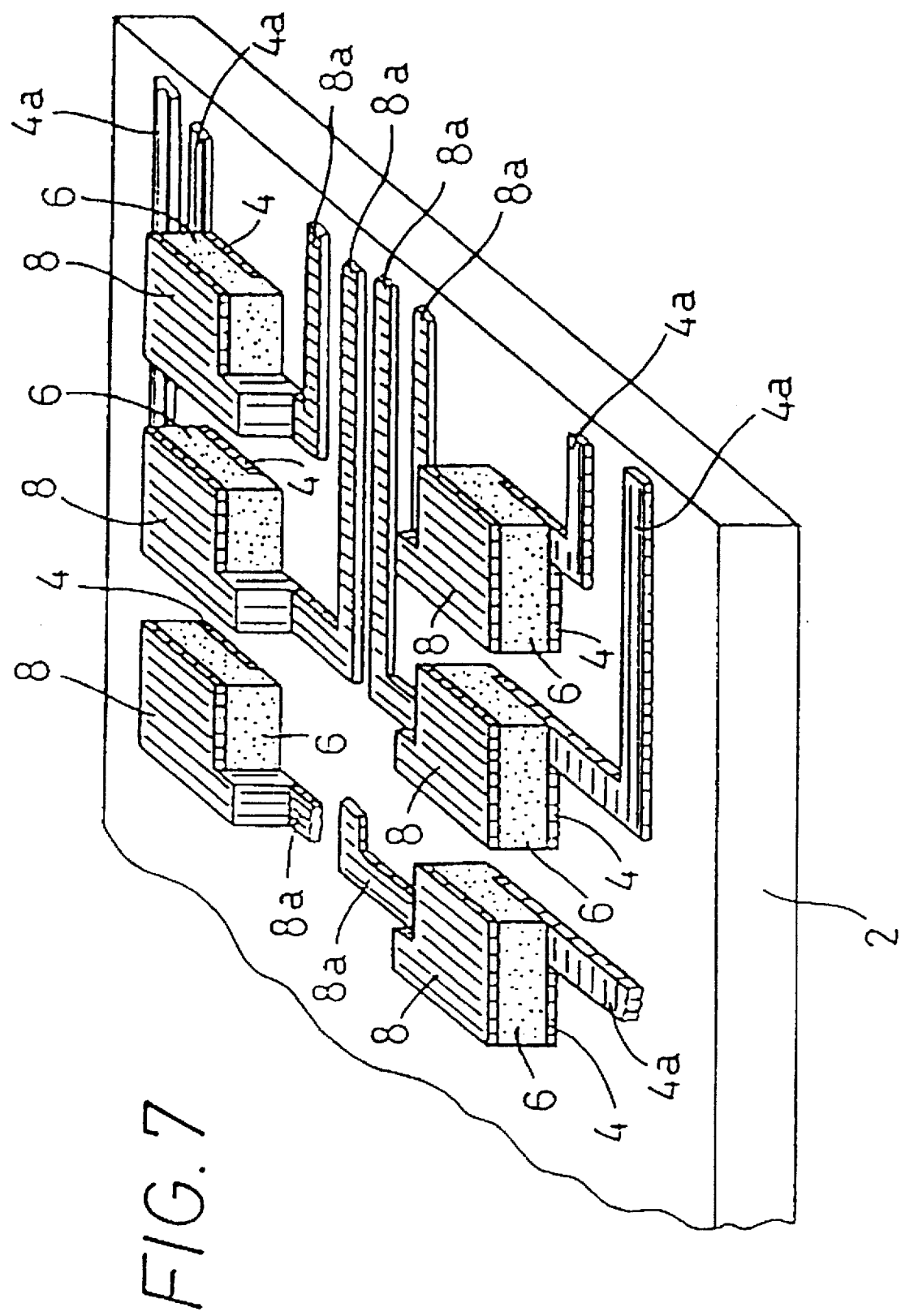

The piezoelectric/electrostrictive actuator illustrated in FIG. 7 uses a relatively large ceramic substrate 2, on which a plurality of piezoelectric/electrostrictive actuator units (4, 6, 8) are formed in two rows parallel to the length of the substrate, such that the piezoelectric/electrostrictive actuator units of each row are disposed at desired spacing distances. Each piezoelectric/electrostrictive actuator unit is a laminar structure consisting of the first and second electrode films 4, 8 and the piezoelectric/electrostrictive film 6 sandwiched between the two electrode films 4, 8, as described above.

In operation of the piezoelectric/electrostrictive actuators as illustrate above, a voltage is applied between the first and second electrode films, 4, 8, so that the piezoelectric/electrostrictive film 6 is exposed to an electric field. As a result, the piezoelectric/electrostrictive film 6 is subject to strains due to the transverse mode of converse piezoelectric or electrostrictive effect produced by the electric field whereby the film 6 undergoes a flexural or bending displacement and produces a force in the direction perpendicular to the plane of the ceramic substrate 2.

In the piezoelectric/electrostrictive actuator constructed according to the present invention, the electrode films 4, 8 and the piezoelectric/electrostrictive film 6 are formed of suitable electrode and piezoelectric or electrostrictive materials, so as to provide a laminar structure of the piezoelectric/electrostrictive actuator unit, which is integrated, by heat treatment, with the ceramic substrate 2 that functions as an oscillating or otherwise operating plate. Namely, the piezoelectric/electrostrictive actuator unit is bonded to the ceramic substrate in the fabrication process, without using a bonding adhesive. There will be descried the fabrication process of the present actuator.

Initially, the first electrode film 4, piezoelectric/electrostrictive film 6 and second electrode film 8 are formed on the ceramic substrate 2, by a method selected from the various known film forming techniques, which include thick-film forming processes such as screen printing, coating processes such as dipping, spinning or spraying, and thin-film forming processes such as sputtering, ion-plating, vacuum vapor deposition, CVD and plating. Although the method of forming these films 4, 6, 8 is not limited to those indicated above, the screen printing and dipping methods are preferred for forming the piezoelectric/electrostrictive film 6, since these methods may use a paste or slurry whose major component consists of a piezoelectric or electrostrictive material, so as to give the film 6 the properties desired for the actuator. The films 4, 6, 8 may be usually patterned in a screen printing or photolithographic process. However, the films may be formed to desired shapes by removing unnecessary portions of the applied masses of the electrode and piezoelectric or electrostrictive materials, by laser machining, or slicing or other mechanical machining process. In particular, it is desirable to concurrently machine the ceramic substrate and the initially applied films into desired shapes, by the laser or mechanical machining process. This process facilitates the patterning of the piezoelectric/electrostrictive actuator units that are formed with high integration density on the substrate.

The construction and the shape or configuration of the actuator are not limited to those illustrated in the drawings, but may be suitably determined depending upon the application of the relevant actuator. For example, the actuator may have a polygonal shape such as triangle, square, pentagon or hexagon, a generally round shape such as circle, ellipse or annulus, or any special shapes, which include a comb-like or lattice-like cellular configuration, and a combination of the two or more shapes indicated above. The principle of the present invention can be advantageously embodied as an actuator having two or more piezoelectric/electrostrictive actuator units formed on the same surface of the substrate, as illustrate in FIGS. 3–7. In particular, the comb-like arrangements of the piezoelectric/electrostrictive actuator units as shown in FIGS. 3–5 are advantageous for increased integration density, and improved displacement and force characteristics.

Where the actuator has a relatively large number of piezoelectric/electrostrictive actuator units on the same substrate, the spacing pitch of the piezoelectric/electrostrictive actuator units is preferably 3000 µm or less, more preferably 1000 µm or less, and most preferably 500 µm or less, so that the actuator has a considerably high integration density of the piezoelectric/electrostrictive actuator units.

The electrode and piezoelectric/electrostrictive films 4, 6, 8 formed on the ceramic substrate 2 by the selected method as described above may be either heat-treated in different steps for integration with the substrate 2 after each of these films is formed, or alternatively concurrently heat-treated in one step for integration with the substrate after at least two or all of the films are formed into a laminar structure on the substrate 2. However, the heat-treatment is not essential, when the film 8 is formed by ion-plating, sputtering, vacuum vapor deposition, CVD or plating. The heat-treatment temperature for integration of the films 4, 6, 8 with the ceramic substrate 2 is generally within a range between 800° C. and 1400° C., preferably within a range between 1100° C. and 1400° C. To avoid a change in the composition of the piezoelectric/electrostrictive material during heat-treatment of the film 6, it is desirable to control the heat-treatment atmosphere, by heating with the evaporation source of the piezoelectric/electrostrictive material.

The ceramic composition for the ceramic substrate 2 may be either an oxide or a non-oxide insulating or dielectric material, which has a high value of mechanical strength and which can be heat-treated. Preferably, the major component of the ceramic composition consists of at least one material selected from among aluminum oxide, magnesium oxide, zirconium oxide, aluminum nitride and silicon nitride. For the substrate to exhibit excellent characteristics with a relatively small thickness, it is desirable that the ceramic composition for the substrate contains aluminum oxide or zirconium oxide as a major component. Further, the content of a glass material, such as silicon oxide or dioxide (SiO, $SiO_2$), contained in the ceramic composition is preferably no more than 10% by weight, and more preferably no more than 3% by weight. The upper limit of the silicon oxide or dioxide is important for preventing reaction thereof with the piezoelectric or electrostrictive material during heat-treatment process, which reaction influences the characteristics of the actuator produced.

According to a finding of the applicants, to assure a high level of operating response and a large amount of flexural or bending displacement or distortion, the thickness of the ceramic substrate 2 is preferably no more than 100 µm, more preferably no more than 50 µm, and most preferably no more than 30 µm, and the Young's modulus of the substrate is preferably between $1.5 \times 10^6$ kg/cm$^2$ and $4.5 \times 10^6$ kg/cm$^2$, and more preferably between $2.0 \times 10^6$ kg/cm$^2$ and $4.0 \times 10^6$ kg/cm$^2$.

The green sheet for the ceramic substrate 2 may be fired before the films 4, 6, 8 are formed on the substrate, or alternatively at least one of the films may be formed on the green sheet before the green sheet is co-fired with the films. However, the films are desirably applied to the sintered ceramic substrate 2, so as to minimize the undesirable warpage or bucking, and dimensional error of the substrate.

Like the piezoelectric/electrostrictive actuator as a whole, the ceramic substrate 2 may have a suitable shape or configuration, depending upon the application of the actuator. For example, the substrate 2 has a polygonal shaped such as triangle or square, a generally round shaped such as circle, ellipse and annulus, or any special shapes which include a comb-like or lattice-like shape, and a combination of the two or more shapes indicated above.

The electrode films 4, 8, in particular, the lower electrode film 4, may be formed of any material which is resistant to a high-temperature oxidizing atmosphere and which does not cause a reaction with the materials of the piezoelectric/electrostrictive film 6, which reaction may change the composition of the film 6, when the film 6 is heat-treated. Described more specifically, the electrode films 4, 8 may consist essentially of at least material selected from the group consisting of: (a) at least one noble metal from the group consisting of platinum, rhodium, palladium and iridium; (b) an alloy including at least one these noble metals, such as platinum-palladium, platinum-gold, platinum-silver, platinum-rhodium, platinum-iridium, and palladium-silver; (c) a mixture of at least one of those noble metals and at least one additive selected from the group selected from aluminum, copper, bismuth, titanium, zirconium, silver, magnesium, vanadium, iron, palladium and lead, or at least one compound thereof; and (d) a mixture of the above-indicated alloy and at least one additive indicated above or at least one compound thereof. The electrode films 4, 8 should not include any inorganic bonding adhesive or agent such as glasses, and are heat-treated with the substrate 2 at a suitable temperature so that the films 4, 8 and the substrate 2 are integrally laminated. Where the upper electrode film 8 is formed on the piezoelectric/electrostrictive film 6 after the film 6 is fired or sintered, the film 8 may be formed of an electrically conductive material which includes at least one material other than the materials indicated above at (a) through (d). Such electrically conductive material includes at least one material selected from the group consisting of gold, silver, copper, aluminum, nickel, titanium and chromium. It is particularly desirable to use a mixture of the ceramic material for the substrate 2 and the ceramic material for the piezoelectric/electrostrictive film 6, as a ceramic additive to be added to the material for the electrode films 4, 8. The use of this ceramic mixture increases adhesion between the films, without relying on a bonding adhesive as described above.

While the thickness of the first and second electrode films 4, 8 of each piezoelectric/electrostrictive actuator unit are suitably selected depending upon the application of the actuator, the thickness of each electrode film is generally no more than 15 μm, and preferably no more than 5 μm.

The piezoelectric/electrostrictive film 6 used for the present actuator may be formed of any piezoelectric or electrostrictive material which produces strain due to the reverse piezoelectric effect or the electrostrictive effect, as well known in the art. The piezoelectric or electrostrictive material may be a crystalline or noncrystalline material, a semi-conductor material, or a dielectric or ferroelectric ceramic material. Further, the piezoelectric or electrostrictive material may either require a treatment for initial polarization or poling, or may not require such a polarization treatment.

The piezoelectric/electrostrictive film 6 may consist essentially of a compound or a mixture or solid solution of compounds, which compound or compounds is/are selected from the group consisting of: lead zirconate titanate (PZT); lead magnesium niobate (PMN); lead nickel niobate (PNN); lead manganese niobate; lead antimony stannate; lead titanate; lead zirconate; barium titanate; lead niobate; and barium niobate. Further, the composition of the film 6 may include a material which consists essentially of at least one oxide or compound of lanthanum (La), barium (Ba), niobium (Nb), zinc (Zn), nickel (Ni), lithium (Li), cerium (Ce), cadmium (Cd), cobalt (Co), chromium (Cr), antimony (Sb), iron (Fe), yttrium (Y), tantalum (Ta), tungsten (W), strontium (Sr), magnesium (Mg), calcium (Ca), bismuth (Bi), tin (Sn) and manganese (Mn). Like the electrode films 4, 8, the piezoelectric/electrostrictive film 6 is heat-treated without any inorganic or organic bonding agents of adhesives, so that the film 6 is integrated with the substrate 2 and the electrode films 4, 8.

In view of the construction of the piezoelectric/electrostrictive actuator according to the present invention, the piezoelectric constant $|d_{31}|$ of the material used for the piezoelectric/electrostrictive film 6 is desirably at least $50 \times 10^{-12}$ [C/N] and more desirably at least $100 \times 10^{-12}$ [C/N], for assuring excellent operating characteristics of the actuator. Further, the thickness of the film 6 is preferably no more than 100 μm, more preferably no more than 50 μm, and most preferably no more than 30 μm, for reducing the required level of a voltage to be applied to the film 6 through the films 4, 8.

While the presently preferred embodiments of the piezoelectric/electrostrictive actuator of this invention have been described in detail by reference to the drawings, it is to be described in detail by reference to the drawings, it is to be understood that the invention is not limited to the details of the illustrated embodiments.

It is also to be understood that the present invention may be embodied with various changes, modifications and improvements, which may occur to those skilled in the art, without departing from the spirit and scope of the invention defined in the following claims.

What is claimed is:

1. A piezoelectric/electrostrictive actuator, formed by a method comprising the following steps:
   providing a sintered non-piezoelectric/non-electrostrictive ceramic substrate;
   forming at least one actuator unit directly on a surface of said sintered non-piezoelectric/non-electrostrictive ceramic substrate, by a method comprising the steps of:
   forming a first electrode film on said surface of said ceramic substrate,
   forming, by a thick-film forming process, a green piezoelectric/electrostrictive ceramic film on said first electrode film, and
   forming a second electrode film on the piezoelectric/electrostrictive ceramic film, and
   sintering at least said green piezoelectric/electrostrictive ceramic film formed on said first electrode film to provide a sintered piezoelectric/electrostrictive ceramic film bonded to the first electrode film without a bonding adhesive.

2. The actuator of claim 1, wherein said substrate has a Young's modulus within a range of $1.5 \times 10^6$ kg/cm$^2$ to $4.5 \times 10^6$ kg/cm$^2$.

3. The actuator of claim 1, wherein said ceramic substrate has a bending strength of at least 1,200 kgf/cm$^2$, and said actuator has a thickness of not greater than 300 μm.

4. The actuator of claim 1, wherein said ceramic substrate includes a major component which consists of at least one material from the group consisting of aluminum oxide, magnesium oxide, zirconium oxide, aluminum nitride and silicon nitride.

5. The actuator of claim 1, wherein said ceramic substrate contains not greater than 3 wt. % of a glass component.

6. The actuator of claim 5, wherein said glass component is silicon oxide.

7. The actuator of claim 1, wherein said at least one actuator unit consists of a plurality of actuator units which are formed on said ceramic substrate.

8. The actuator of claim 7, wherein said actuator units are arranged in a direction perpendicular or parallel to a plane of the substrate.

9. The actuator of claim 1, wherein said ceramic substrate has a thickness of not greater than 100 μm.

10. The actuator of claim 1, wherein said piezoelectric/electrostrictive film has a thickness of not greater than 100 μm.

11. The actuator of claim 1, wherein said piezoelectric/electrostrictive film undergoes a bending displacement caused by a transverse mode of a converse piezoelectric effect or an electrostrictive effect upon application of a voltage between said first and second electrode films.

12. The actuator of claim 1, wherein said piezoelectric/electrostrictive film consists essentially of a compound, a mixture or a solid solution of compounds selected from the group consisting of: lead zirconate titanate (PZT); lead magnesium niobate (PMN); lead nickel niobate (PNN); lead manganese niobate; lead antimony stannate; lead titanate; lead zirconate; barium titanate; lead niobate; and barium niobate.

13. The actuator of claim 12, wherein the piezoelectric/electrostrictive film further contains a material which consists essentially of at least one oxide or compound of lanthanum (La), barium (Ba), niobium (Nb), zinc (Zn), nickel (Ni), lithium (Li), cerium (Ce), cadmium (Cd), cobalt (Co), chromium (Cr), antimony (Sb), iron (Fe), yttrium (Y), tantalum (Ta), tungsten (W), strontium (Sr), magnesium (Mg), calcium (Ca), bismuth (Bi), tin (Sn) and manganese (Mn).

14. The actuator of claim 1, wherein said piezoelectric/electrostrictive film is formed by printing.

15. The actuator of claim 1, wherein the first and second electrode films are formed by printing.

16. The actuator of claim 1, wherein at least one of said first and second electrode films consists essentially of an electrically conductive material and a ceramic material.

17. The actuator of claim 16, wherein said ceramic material comprises at least one of said material of said substrate and the material of said piezoelectric/electrostrictive film.

18. The actuator of claim 17, wherein said ceramic material is the material of said substrate, and is contained in said at least one of said first and second electrode films in an amount of 5–30% by volume.

19. The actuator of claim 17, wherein said ceramic material is the material of the piezoelectric/electrostrictive film, and is contained in said at least one of said first and second electrode films in an amount of 5–20% by volume.

20. The actuator of claim 1, wherein the first electrode film consists essentially of one material from the group consisting of a single noble metal, an alloy including said noble metal, a mixture including said noble metal, and a mixture of a ceramic and one of said alloy and said noble metal.

21. The actuator of claim 20, wherein said first electrode film consists essentially of said single noble metal, said single noble metal being selected from the group consisting of platinum, rhodium, palladium and iridium.

22. The actuator of claim 20, wherein said first electrode film consists essentially of said alloy, said alloy being selected from the group consisting of platinum-palladium, platinum-gold, palladium-silver, platinum-rhodium, platinum-iridium and platinum-silver.

23. The actuator of claim 20, wherein said first electrode film consists essentially of said mixture including said noble metal, the mixture containing an additive selected from the group consisting of aluminum, copper, bismuth, titanium, zirconium, silver, magnesium, vanadium, iron, palladium and lead, or at least one compound thereof.

24. The actuator of claim 20, wherein said first electrode film consists essentially of said mixture including said noble metal, the mixture additionally including an alloy selected from the group consisting of platinum-palladium, platinum-gold, platinum-silver, platinum-rhodium, platinum-iridium, and palladium-silver; and at least one additive selected from the group consisting of aluminum, copper, bismuth, titanium, zirconium, silver, magnesium, vanadium, iron, palladium, and lead or at least one compound thereof.

* * * * *